US 6,722,557 B2

(12) United States Patent
Tanaka

(10) Patent No.: US 6,722,557 B2
(45) Date of Patent: Apr. 20, 2004

(54) FLUX CLEANING METHOD AND METHOD OF MANUFACTURING SEMICONDUCTOR DEVICE

(76) Inventor: Tohru Tanaka, c/o Sony Corporation 7-35, Kitashinagawa 6-Chome, Shinagawa-Ku, Tokyo (JP)

( * ) Notice: Subject to any disclaimer, the term of this patent is extended or adjusted under 35 U.S.C. 154(b) by 0 days.

(21) Appl. No.: 09/860,043

(22) Filed: May 17, 2001

(65) Prior Publication Data
US 2001/0042778 A1 Nov. 22, 2001

(30) Foreign Application Priority Data
May 19, 2000 (JP) ..................... P2000-147835

(51) Int. Cl.⁷ .................. B23K 1/20; B23K 31/02; C23G 1/00; C23C 30/00
(52) U.S. Cl. .................. 228/207; 228/19; 228/206; 228/208; 228/180.22; 134/2; 134/3; 148/22; 148/23
(58) Field of Search .................. 228/207, 201–206, 228/208, 19, 180.22; 134/1, 2, 3; 510/175; 148/23–26, 22

(56) References Cited

U.S. PATENT DOCUMENTS

| 4,504,007 A | * | 3/1985 | Anderson et al. ........ 228/123.1 |
| 5,064,480 A | * | 11/1991 | Dershem et al. .............. 148/22 |
| 5,176,759 A | * | 1/1993 | Taguchi ....................... 148/23 |
| 5,196,070 A | * | 3/1993 | Ables et al. .................... 148/23 |
| RE35,045 E | * | 10/1995 | Winston et al. ................. 134/2 |
| RE35,045 E | * | 10/1995 | Winston et al. ................. 134/2 |
| 5,693,599 A | * | 12/1997 | Aoyama et al. ............ 510/175 |
| 5,759,285 A | * | 6/1998 | Buchwalter et al. ........... 134/3 |
| 5,821,208 A | * | 10/1998 | Cala et al. ................... 510/175 |
| 5,849,106 A | * | 12/1998 | Bolden et al. ........... 228/111.5 |
| 5,928,432 A | * | 7/1999 | Foederl et al. ................. 134/2 |
| 5,938,856 A | * | 8/1999 | Sachdev et al. ............. 134/1.3 |
| 5,958,144 A | * | 9/1999 | Cala et al. ...................... 134/2 |
| 5,988,485 A | * | 11/1999 | Master et al. .......... 228/180.22 |
| 6,123,248 A | * | 9/2000 | Tadauchi et al. ......... 228/111.5 |
| 6,140,286 A | * | 10/2000 | Watanabe et al. .............. 134/2 |
| 6,402,013 B2 | * | 6/2002 | Abe et al. .................... 228/223 |
| 6,446,855 B1 | * | 9/2002 | Rich .......................... 510/175 |
| 6,474,536 B1 | * | 11/2002 | Kukanskis ................. 228/207 |

FOREIGN PATENT DOCUMENTS

JP           03-062895 A  *  3/1991

* cited by examiner

Primary Examiner—Lynne Edmondson
(74) Attorney, Agent, or Firm—Robert J. Depke; Holland & Knight LLC

(57) ABSTRACT

An effective method for cleaning flux residues produced in process of fabricating semiconductor devices, and a method of fabricating the semiconductor devices including this cleaning method are provided. The flux cleaning method for cleaning the solder bump electrodes formed using a flux comprises the steps of: applying a pretreatment process including coating of the solder bump electrode with the flux and applying a heat treatment thereto, and carrying out the flux cleaning to clean the heat-treated flux.

13 Claims, 9 Drawing Sheets

FLUX CLEANING METHOD AND METHOD OF MANUFACTURING SEMICONDUCTOR DEVICE

BACKGROUND OF THE INVENTION

1. Field of the Invention

The present invention relates to a flux cleaning process suitable for processing semiconductor devices, and to a method of manufacturing the semiconductor devices.

2. Related Art

Along with a recent development in a high density packaging technology for packaging electronics components and parts, a further compactness in a semiconductor package is demanded. Now, as such an example of semiconductor packaging for providing a compacter design of electronic devices, a flip-chip connection process is drawing attention and becoming to be an indispensable process therefor, whereby a solder bump which is formed on an electrode pad on a semiconductor chip is electrically and physically connected with an electrode terminal provided on a packaging printed circuit board.

This method of forming the solder bump can be divided roughly into two approaches: one to form solder bumps in batch on a wafer; the other to form solder bumps respectively on an individual semiconductor chip after it was diced from the wafer. However, it is preferable to form solder bumps in batch on the wafer from the viewpoint of economy of a production cost.

As an example of forming solder bumps in batch in a stage of the wafer for reducing the production cost significantly, there is such a process of forming solder bumps whereby, by using a high precision printing method using a solder paste and a screen mask, solder is transferred onto a semiconductor chip electrode to form a solder bump.

Now, with reference to FIGS. 8A through 10B, a method of forming solder bumps by printing will be described by way of example of a solder paste 32 printed on a semiconductor wafer 1. FIGS. 8A to 10B show cross-sections of a screen mask 41 and a wafer 44 in each step of the solder printing method.

With reference to FIG. 8A, at first, a bottom surface 42 of the screen mask 41 having perforation 43 formed in a predetermined pattern is placed on a wafer 44 in face-to-face contact. Then, a solder paste 32 is supplied to an upper surface 37 of the screen mask 41. In the next step of FIG. 8B, a squeegee 30 with its tip end contacting the upper surface 37 of the screen mask is moved in a direction of an arrow under application of a downward pressure, so as to roll and fill the solder paste 32 into the perforation 43 of the screen mask 41.

Then, as illustrated in FIG. 9A, the screen mask 41 is lifted off from the wafer 44. As a result, as shown in FIG. 9B, the solder paste 32 filled in the perforation holes 43 is transferred onto the wafer 44, thereby depositing the solder paste 32 on an electrode pad 36 formed on the wafer 44 in a predetermined pattern.

Subsequently, as illustrated in FIG. 10A, the wafer 44 is wholly heated with a heating system such as a heater 45 or the like. A rosin group flux contained in the solder paste 32, when heated by the heater 45, is activated to effectuate removal of an oxide on the electrode pad 36 by reduction reaction so as to provide a clean metal surface. Then, a powder solder contained in the solder paste 32 is melted to form a round swell by a surface tension, which then wets and spreads only on the surface of the electrode pad 36 which is cleaned by the flux, then to form a bump electrode 35. This heating treatment is generally referred to as a "wet back".

As illustrated in FIG. 10B, compositions of the flux contained in the solder paste 32 which spill out while heating adhere, as a flux residue 34, to a surface of the solder bump electrode 35 and a peripheral area in the vicinity of a bordering region between the solder bump electrode 35 and the wafer 44. Although the flux residue 34 adhered to the surface of the solder bump electrode 35 can be removed by a normal flux cleaning process using, for example, a hydrocarbonic group cleaning agent, the other flux residue 35 adhered to the peripheral area in the vicinity of the bordering region between the solder bump electrode 35 and the wafer 44 cannot be removed.

Then, as illustrated in FIG. 11, a semiconductor chip 38 diced from the wafer 44 into an individual semiconductor chip is soldered onto an electrode portion 40 of a printed circuit board 39 via a bump electrode 35. At the time of soldering, because the flux residue 34 remains on the surface of the solder bump electrode 35, unless cleaning thereof is done sufficiently, the flux residue 34 is included between the surface of the printed circuit board electrode 40 and the surface of the bump electrode 35, and is left as inclusion in a portion of the solder bump connection, thereby deteriorating an adhesion strength and reliability, and further causing an insufficient wettability portion 46.

Generally, in order to increase adhesion strength in the solder bump connection portion, a resin 31 is filled in a gap between the semiconductor chip 38 and the printed circuit board 39 to seal therebetween. However, if a sticky flux residue 34 is left in the vicinity of the surface of the semiconductor chip 38, a filling performance of the sealing resin 31 is affected to deteriorate the adhesion strength between the semiconductor chip 38 and the sealing resin 31, thus degrading the reliability of the device. For this reason, it is especially important and indispensable completely to remove the flux residue 34 from the periphery of the solder bump electrode 35 prior to mounting the semiconductor chip on the printed circuit board 39.

As a rosin group flux cleaning agent, solvents such as Freon (chlorofluorocarbon) or trichlene (trichloroethylene) cleaning agents have been used heretofore, however, as they may involve environmental problems such as destruction of the ozone layer, global pollution or the like, hydrocarbon group and terpene group cleaning agents are now being used instead of the Freon or trichlene cleaning agents. By the way, when using these cleaning agents they are heated. Although a cleaning performance improves at higher temperatures, in consideration of various factors such as an increasing amount of evaporation at higher temperatures (in terms of economy), flammability, safety and the like, they cannot be used at temperatures higher than 80° C. or so.

If these flux residues are tried to be removed by cleaning using these cleaning agents, however, these flux residues cannot be removed completely permitting some of the flux residues to remain adhering to the bordering and adjacent area between the solder bump electrode and the semiconductor chip. Normally, a thixotropic substance is contained in the solder paste for the purpose of securing its printed pattern to be retained, wherein an amido-fatty acid therein which is widely used because of its excellent performance cannot be removed easily with the normal cleaning agents for use in the normal flux cleaning. Although the flux residue may be removed by mechanically rubbing the wafer or by applying a ultrasonic cavitation (vibration) thereto, it is not permitted to give such a mechanical shock or damage to the semiconductor chip having bumps attached thereto.

SUMMARY OF THE INVENTION

The present invention has been contemplated to solve the above-mentioned problems associated with the related art, and to provide a novel method capable of efficiently cleaning flux residue which is produced in process of fabricating semiconductor devices, and a method of manufacturing semiconductor devices including this novel cleaning method.

Namely, the present invention is directed to a method of flux cleaning for cleaning a solder electrode portion which is formed using the flux, comprising: a step of coating a flux on the solder electrode portion, a step of a heat treatment thereof, and a step of the cleaning. Further, the present invention is directed to a method of manufacturing a semiconductor apparatus, comprising: a step of mounting a semiconductor chip on a printed circuit board using the solder electrode portion after the flux cleaning.

According to the flux cleaning process according to the present invention, comprising the steps of executing preliminary cleaning process using the flux, then applying the normal cleaning process using such as hydrocarbonic group or terpene group cleaning agents, is applied to a semiconductor wafer or the like as a pretreatment step prior to subjecting to the normal flux cleaning process therefor, a complete flux residue-free cleaning of the wafer can be attained. This flux cleaning process can be applied widely irrespective of the types of substrates on which the solder paste printing is to be applied, therefore, this is also applicable to cleaning of the flux on the solder bump electrode formed on the semiconductor wafer using the solder paste printing process. Further, this process can be applied to the process of forming solder bumps using a metal ball instead of the solder paste, or to a process of forming solder bumps on the side of a printed circuit board.

PREFERRED EMBODIMENTS OF THE INVENTION

Process of the cleaning and the method in accordance with an embodiment of the present invention may be described more specifically in the following comprises the steps of: forming a solder electrode portion by the solder paste printing process or the solder ball mounting process; coating this solder electrode portion with a flux; applying a heat treatment thereto; and cleaning the flux, wherein the above-mentioned heat treatment is carried out at temperatures not lower than 150° C., and for a period of time not shorter than one minute (though in a condition that the solder should not melt).

Further, in accordance with an embodiment of the present invention, the above-mentioned flux may contain a thixotropic substance, and a hydrocarbonic group cleaning agent may be used for the cleaning of the flux.

Still further, in accordance with an embodiment of the present invention, the solder electrode portion may be formed on a semiconductor wafer or on a printed circuit board.

Preferred embodiments of the present invention will be described more specifically with reference to the accompanying drawings in the following.

FIGS. 4A through 5C illustrate steps of a flux cleaning process in accordance with an embodiment of the present invention.

Figure 4A:
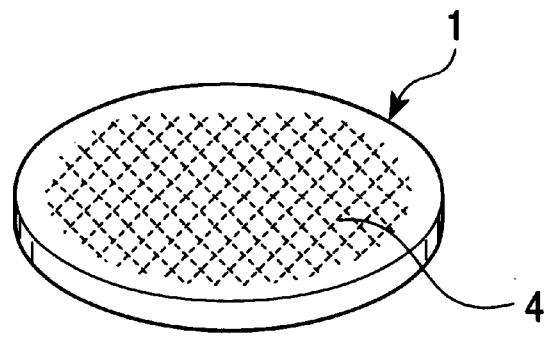
FIGS. 4A–4C show perspective views of wafers in sequential steps of the flux cleaning process.

Namely, FIGS. 4A through 5C are schematic drawings illustrating respective steps of the flux cleaning process according to the present embodiment. As shown in FIG. 4A, solder bumps 4 are formed on a wafer 1 by the solder paste printing and reflow heating processes. Then, as shown in FIG. 4B, a flux 2 is dripped on the surface of the wafer 1, while rotating the wafer 1, so as to spin-coat the flux uniformly on a whole surface thereof. Subsequently in the step of FIG. 4C, a whole area of the wafer 1 is heated with a wafer heat treatment heater 3. The heating temperatures may be in a range from 150 to 180° C., and a period of time of the heating for one to two minutes. Then, the wafer 1 is subjected to the cleaning process using cleaning agents or the like.

Further, because a residue of the thixotropic substance or a white slug residue sticking to the surface of the wafer 1 is difficult to melt unless it is heated, the above-mentioned heating treatment is carried out in order to melt these residues into the flux 2. By the way of example, its heating temperature and its heating period of time are preferably within a range that ensures the solder not to melt.

If the thixotropic substance is added to the flux for the purpose described above, the residue thereof is hardly removed in the normal cleaning process. However, in the flux cleaning process according to the present invention, these residues can be cleaned up satisfactorily.

Figure 5A:
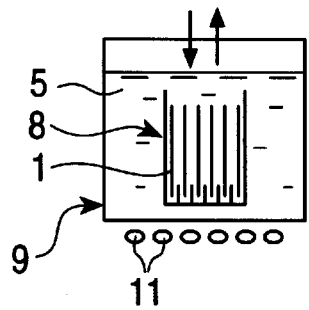
FIGS. 5A–5C show cross-sectional views illustrating respective steps of the flux cleaning process.
Figure 5B:
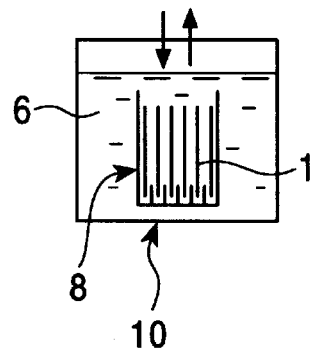
Figure 5C:
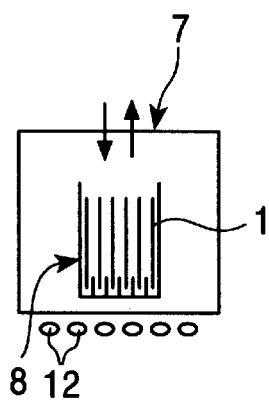

With reference to FIGS. 5A–5C, respective steps of cleaning of the wafer 1 coated with the flux 2 through drying thereof will be described. Arrows indicate paths of transfer of a wafer carrier 8.

At first, in the step of FIG. 5A, the wafer carrier 8 holding wafers 1 is immersed in a cleaning vessel 9 filled with a cleaning agent solution 5 which is heated by heaters 11 to clean up the flux residue sticking to the wafers 1.

Then, the wafer carrier 8 holding wafers 1 is lifted up from the cleaning vessel 9, and immersed in a rinse vessel 10 filled with a rinse solution 6 as shown in FIG. 5B to rinse the wafers 1.

Then, as shown in FIG. 5C, the wafer carrier 8 holding the wafers 1 is lifted up from the rinse vessel 10, and lifted down into a heat dryer unit 7 to be heated with heaters 12 for drying the wafers 1.

The wafers 1 as contained in the wafer carrier 8 are removed from the heat dryer unit 7, thereby completing the process of the flux cleaning and the wafer drying according to the present embodiment.

The process of the present embodiment described hereinabove will be described more specifically in detail with reference to FIGS. 1A through 3B.

Figure 1A:
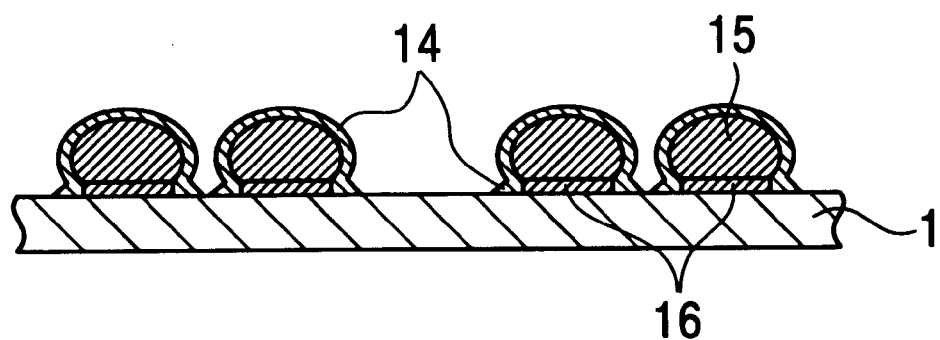
FIGS. 1A–1B show cross-sectional views of a wafer and a flux cleaning process therefor in sequential steps according to one embodiment of the invention.
Figure 8A:
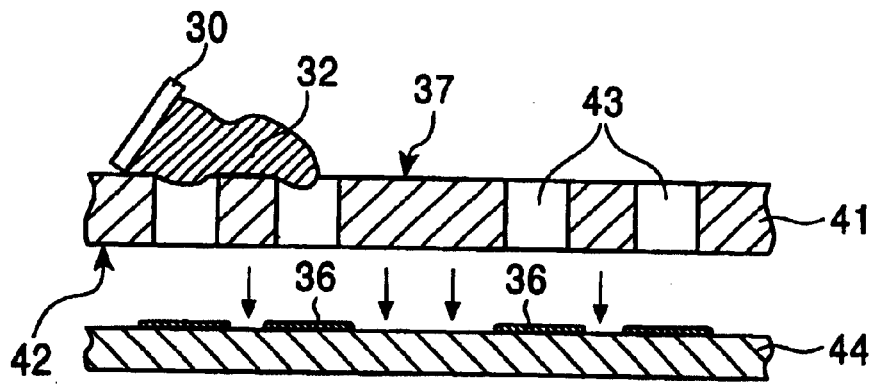
FIGS. 8A–8B show cross-sectional views illustrating a conventional solder paste printing process for printing on a wafer.
Figure 8B:
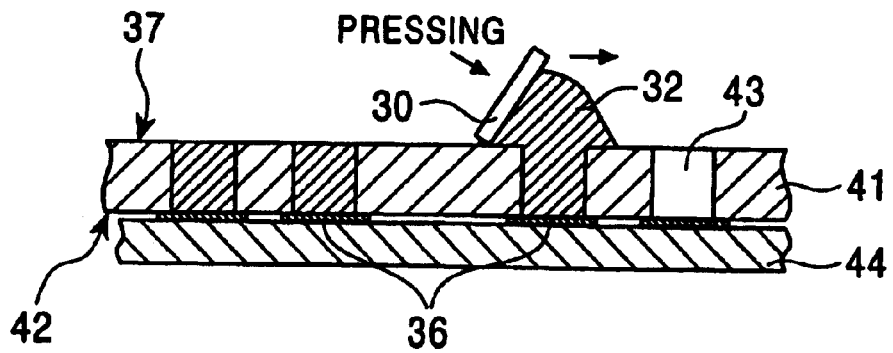
Figure 9A:
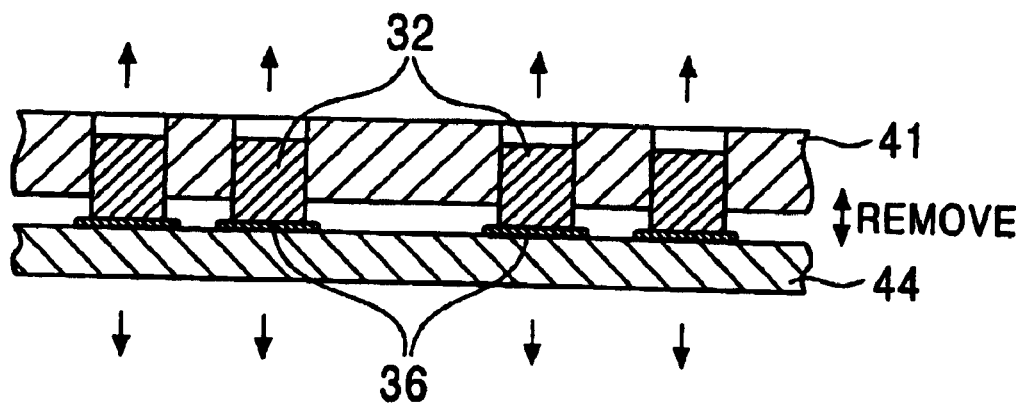
FIGS. 9A–9B show cross-sectional views illustrating the wafer from which the screen mask is being lifted up and the solder paste is printed thereon.
Figure 9B:
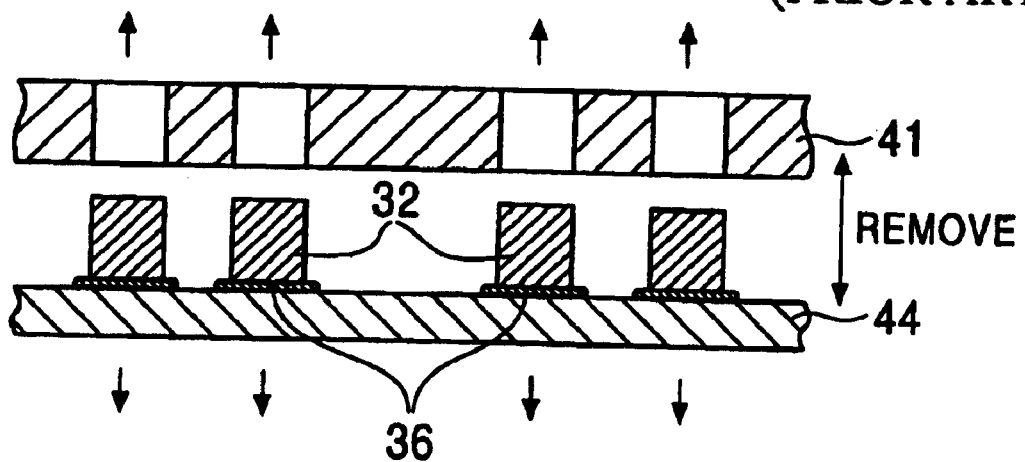
Figure 10A:
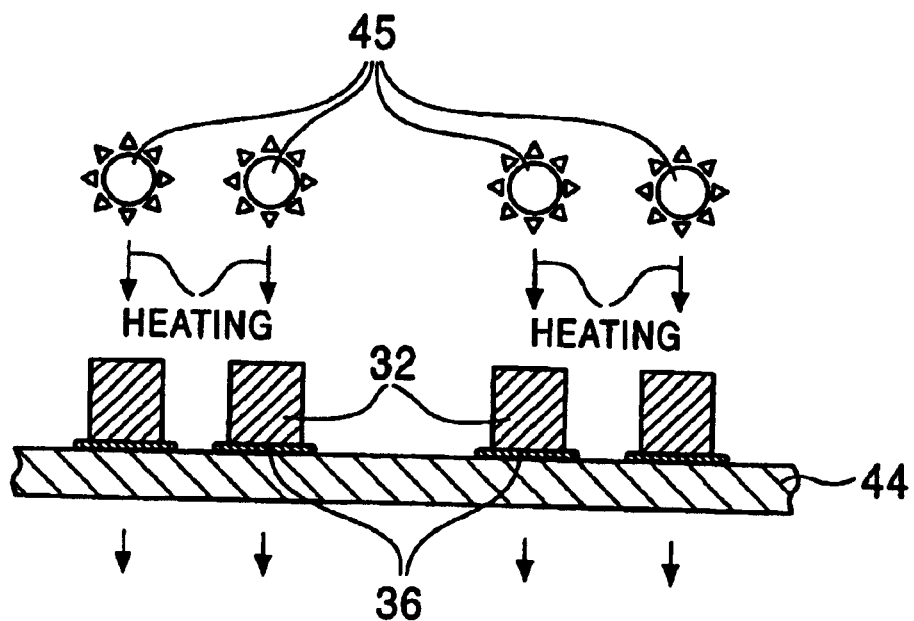
FIGS. 10A–10B show cross-sectional views illustrating a conventional process of forming solder bumps using the solder paste.
Figure 10B:
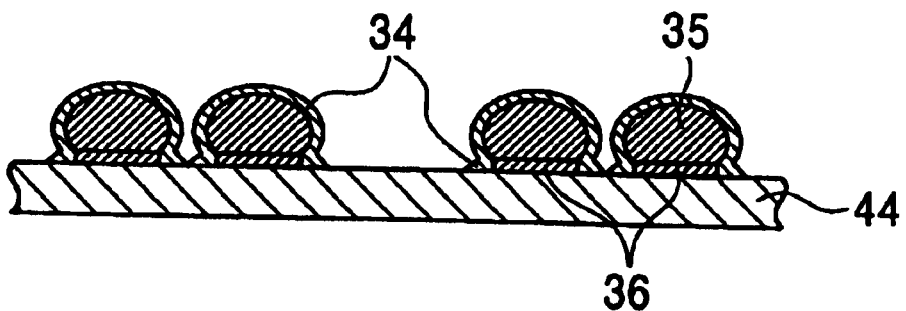
Figure 11:
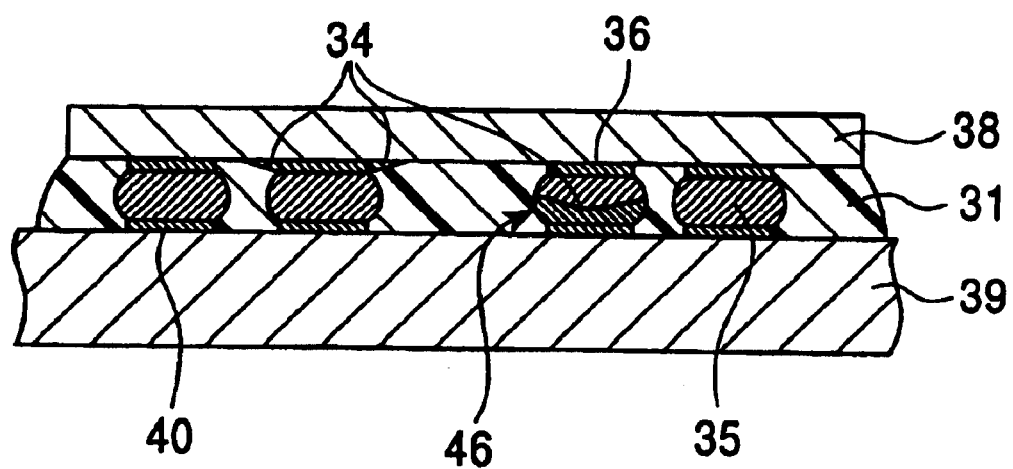
FIG. 11 shows a cross-sectional view illustrating the flux residue remaining in the vicinity of the solder bumps in the conventional packaging.

FIG. 1A is a cross-sectional view in detail of the wafer 1 shown in FIG. 4A (the same steps of the processing as illustrated in FIGS. 8 through 10 are applied in order to obtain this wafer 1). As illustrated in FIG. 1A, flux residues 14 are sticking to the surfaces of the wafer 1 and the solder bump electrode 15 as well as to a bordering region between the wafer 1 and the solder bump electrode 15.

Figure 1B:
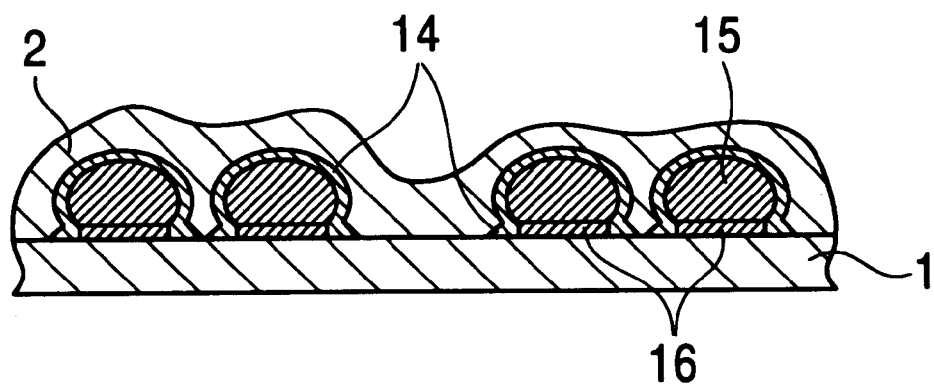
Figure 4B:
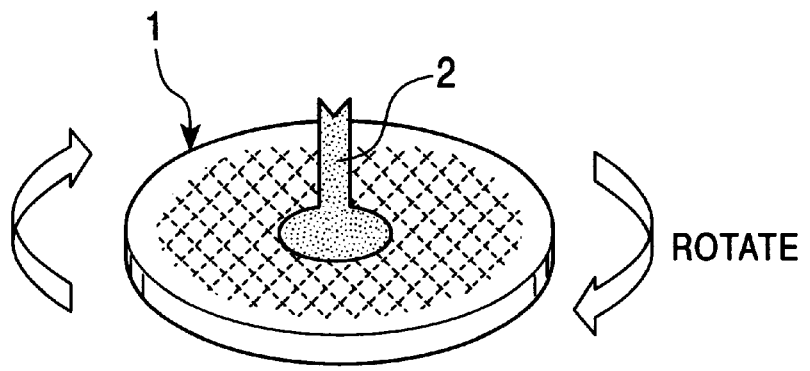

FIG. 1B is a cross-sectional view in detail of the wafer 1 corresponding to FIG. 4B. As illustrated in FIG. 1B, the flux 2 is spin-coated over the surface of the wafer 1 which has flux residue 14 attached thereto.

Figure 2:
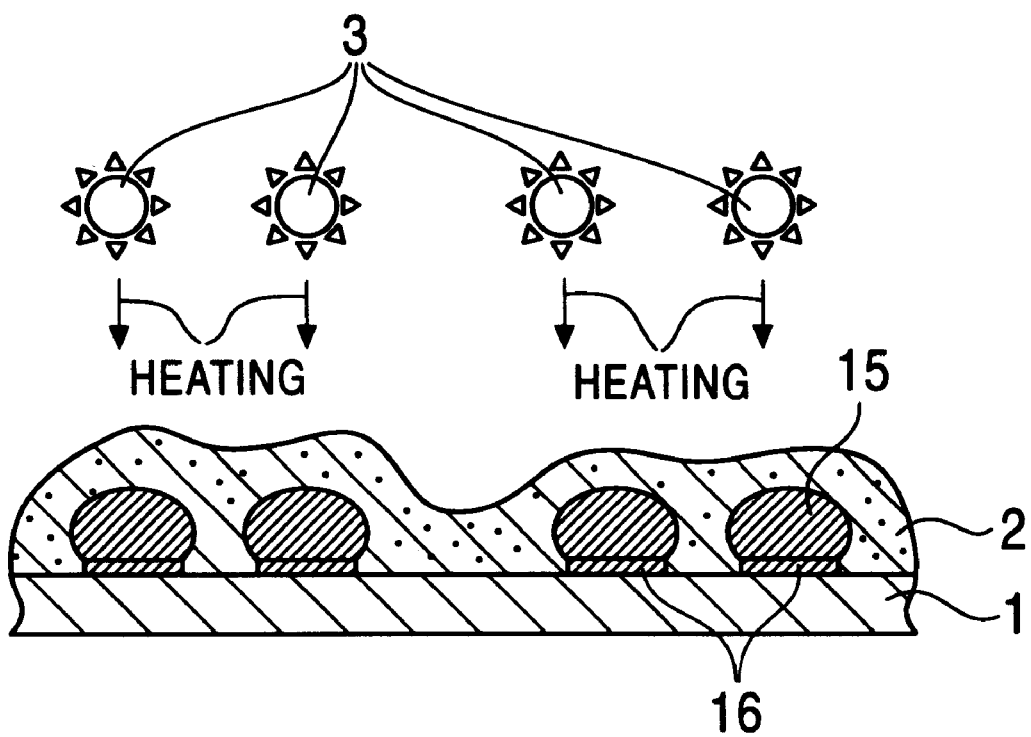
FIG. 2 shows a cross-sectional view of the wafer in another step of the flux cleaning process therefor.
Figure 4C:
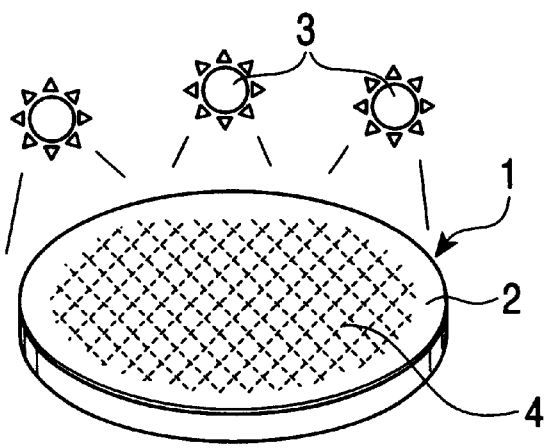

Next, FIG. 2 is a cross-sectional view in detail of the wafer 1 corresponding to FIG. 4C. As illustrated in FIG. 2, the flux 2 coated on the wafer 1 is heated using wafer heater (for example, lamps) 3. Upon heating, the flux residues 14 adhering thereto are caused to melt into the flux 2.

Figure 3A:
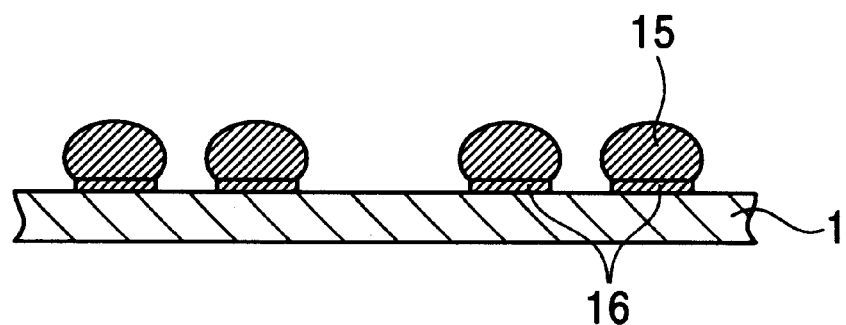
FIGS. 3A–3B show a cross-sectional view of the wafer in a step of mounting on a printed circuit board after a flux cleaning.

Subsequently, when the normal flux cleaning process shown in FIGS. 5A–5C is carried out, the wafer 1 shown in FIG. 3A having solder bump electrodes 15 formed thereon is obtained, which is completely free of flux residue 14 and the flux 2.

Figure 3B:
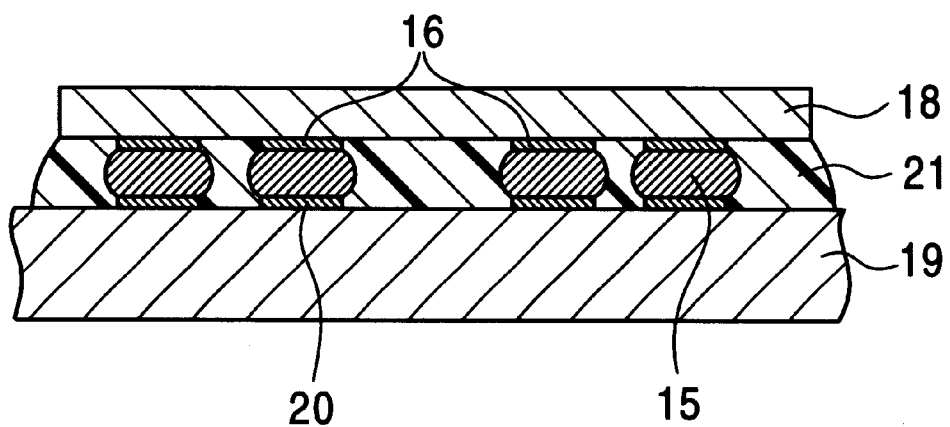

FIG. 3B shows a semiconductor chip 18 which is mounted on a printed circuit board 19. By way of example, this semiconductor chip 18 is a chip diced from the wafer 1 of FIG. 3A cut in a scribe line, which is free from the flux. For mounting the semiconductor chip on the printed circuit board, an electrode pad 16 of the semiconductor chip and an electrode portion 20 of the printed circuit board corresponding thereto are electrically connected via a solder bump electrode portion 15, then a sealing resin 21 is filled a gap in between to bond them firmly.

A purpose in general for using the flux 2 is to clean oxides existing on the surfaces of the substrate and the solder alloy, and provide a clean metal surface at the time of soldering. However, the object of using the flux according to the present invention is to melt the flux residues in the flux.

That is to say, the white slug residue sticking to or the flux residue of the thixotropic substance is found easily to resolve into the flux 2 if immersed in a melt liquid of the flux which is heated at temperatures not lower than 150° C. By the way, because the flux 2 can be used at temperatures in a range substantially higher than 150° C., there occurs no problem if it is used at a temperature of 150° C. or higher. Further, the flux at temperatures approximately of 150° C. does not cause any influence on the solder bump to change its shape. Depending on compositions of a material of the solder though, there is such a soldering material that has a low melting point approximately around 150° C. However, because the shape of a solder bump once it has been formed is retained by its surface tension, it does not bleed off to bridge with a neighboring solder electrode.

According to the feature of the embodiment of the present invention realized by providing the pretreatment cleaning process prior to the normal flux cleaning step, which pretreatment process comprising a substantially simple process including a step of coating with the flux and heating thereof, the white slug residue and the thixotropic residue produced from the flux contained in the solder paste as its flux residue which cannot be removed by the conventional process have been enabled to be cleaned up easily in the subsequent normal cleaning step to follow, thereby providing the semiconductor chip having highly reliable and defect free solder bumps formed thereon.

That is to say, if the aforementioned process according to the embodiment of the present invention is applied prior to the normal flux cleaning step, a very efficient flux cleaning which ensures complete removal of the flux residues can be attained in combination with the normal cleaning process to follow using the normal hydrocarbonic group or terpene group cleaning agents. This novel pretreatment process can be applied widely, irrespective of the types of substrates to be processed by the solder paste printing method, and can be applied also to the flux cleaning for removing the flux and its residue sticking to the solder bump electrodes on the semiconductor wafer formed by the solder paste printing method.

By the way, it should be noted that various modifications of the above-mentioned embodiments of the present invention can be contemplated within the scope and spirits of the present invention.

For example, the wafer used here may be of any size and any form if it can be immersed in the cleaning vessel. Further, a direction of rotation and/or a pattern of rotation of the wafer 1 can be varied corresponding to a property of the flux 2 to be dripped thereon. For example, such a pattern of rotation may be used including anti-clockwise rotation followed by a clockwise rotation, then again followed by the anti-clockwise rotation.

Further, a quantity of the flux 2 to be supplied and a rate of dripping may be varied depending on the property of the flux 2 and a size of the wafer 1 or any other conditions concerned.

Still further, the period of time for heating the wafer 1 by the heater 3, and its temperature may be changed at discretion according to the properties of the flux and the solder.

Still more, the method of heating the wafer 1 may use a normal infrared heating system or a reflow furnace by a hot air forced convection heating system. Further more, a heating system using a hot plate or an oven may be used as well.

Moreover, a mesh-screen printing process or the like instead of the spin-coat process can be adopted for coating the flux as well.

The flux 2 used here is not limited to a specially formulated material, but a material available on the market such as a rosin group flux RM5168 manufactured by Japan Alpha Metals K.K. may be used.

By the way, the rosin group flux available on the market is normally added with an activator such as halogen, amine, organic acid and the like depending on its purpose. Basically, however, the flux to be used here does not utilize such activation function and therefore does not require such activators. Therefore, there is no need to develop a new flux which is free of such activators. Any flux available on the market can be used as it is for the purpose of the present invention.

Still further, as for the cleaning agent 5, such as Elise M9000 of a hydrocarbonic group manufactured by Asahi Kasei K.K., Micro Clean WS-1014 manufactured by Kaken Tech. K.K. of the same material, EC-7R manufactured by Nihon Alpha Metals K.K. of a terpene group, or the like can be used. The cleaning process to follow the pretreatment process is preferably the immersion process which is most simple and does not cause a damage to the substrate.

As another method of forming the solder bump electrodes instead of the printing method described above, there is a solder ball mounting method. Because, most cases, this method uses a flux and a solder paste having an addition of a large quantity of the thixotropic substance, the aforementioned cleaning process according to the present invention can be applied likewise. By the way, although the bump is also formed using the flux in a solder vaporization method and a solder plating method, these methods do not require addition of the thixotropic substance, and thus it is basically not added to the flux, thereby eliminating the problem of the thixotropic residual after its cleaning step.

Figure 6A:
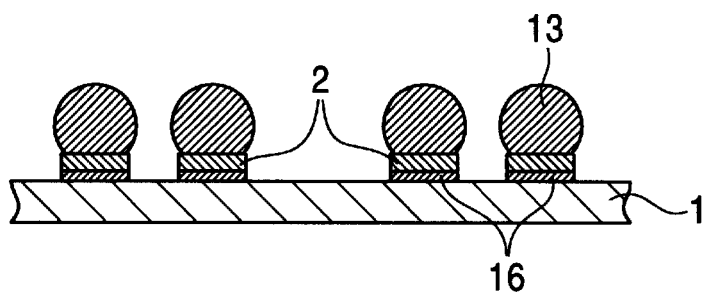
FIGS. 6A–6B show cross-sectional views of a wafer and a flux cleaning process therefor in sequential steps according to another embodiment of the invention.
Figure 6B:
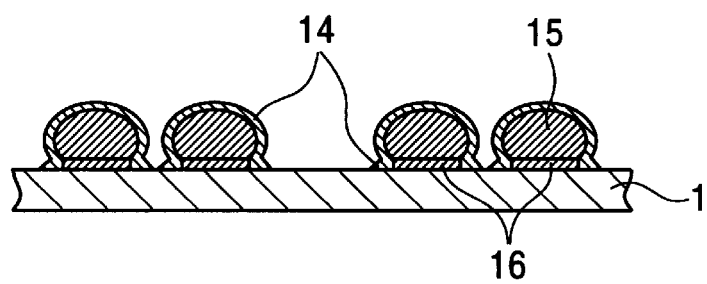
Figure 7:
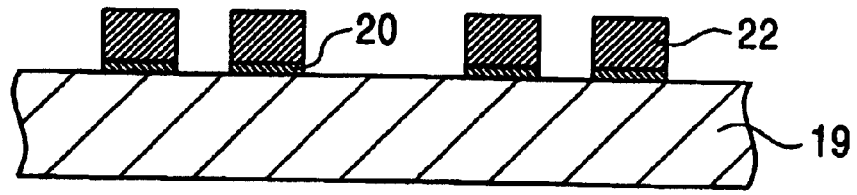
FIG. 7 shows a cross-sectional view of a printed circuit board having a solder paste coated thereon according to still another embodiment of the invention.

Further, as illustrated in FIG. 6A, the above-mentioned flux cleaning process according to the present invention can be applied to a process of forming solder bumps by a metal ball method using metal balls 13 instead of the solder paste. Although there is formed a flux residue 14 as shown in FIG. 6B, this residue can be pretreated and removed by the above-mentioned process according to the present invention. Further, as illustrated in FIG. 7, when a solder bump is formed using the solder paste 22 on the side of the printed circuit board 19, this process according to the present invention can be applied also for removing a flux residue resulting from the wet back.

There are various kinds of materials for use as the solder bump, which include a tin/lead eutectic solder which is most popular, a high temperature melting solder with a large content of lead, a lead-free solder and the like, however, the above-mentioned cleaning process according to the present invention is applicable to any solder having any composition described above. For example, although a typical melting point of the tin/lead eutectic solder is at 183° C., it undergoes the wet back normally at temperatures approximately of 200–230° C., and the high melting point solder of tin 5% and lead 95% undergoes the wet back at temperatures approximately from 310 to 330° C. By the way, because the solder has undergone heating and because of its hysteresis of having been heated at high temperatures, the solder will not melt at temperatures approximately from 150 to 180° C. which is lower than its previous heating, however, at which temperatures only and all the flux residues melt in so as to be removed.

In addition, the flux cleaning process according to the present invention described heretofore is considered to be applicable not only to the flux cleaning of the semiconductors but also to the flux cleaning of the other electronic parts. Further, the normal cleaning process to follow is not limited to that described above, but also any other cleaning process may be used.

Conclusively, in the flux cleaning process according to the present invention for cleaning the residues of the solder flux sticking to the solder electrode portions formed with the flux, the cleaning process is comprised of the steps of: coating the aforementioned solder electrode portions with the flux and heating the same as the simple pretreatment prior to the normal cleaning process; then carrying out the normal flux cleaning process using the hydrocarbonic group or terpene group cleaning agents, thereby an excellent flux cleaning method completely free of the residues of the flux has been accomplished, thereby enabling the highly reliable solder bumps to be formed on the wafer. Further, this flux cleaning process can be applied to the treatment of any types of substrates applied with the solder paste printing, for example, it can be applied also to the flux cleaning of the solder bump electrodes formed on the semiconductor wafer by the solder paste printing.

What is claimed is:

1. A flux cleaning method for removing a flux residue that remains on or adjacent to a solder electrode portion after formation using a flux, comprising the steps of:

coating said solder electrode portion with flux material that is not substantially comprised of a cleaning solution and, applying a heat treatment thereto, and thereafter carrying out a flux cleaning process of the solder electrode portion.

2. The flux cleaning method according to claim 1, wherein:

said solder electrode portion is formed by a solder paste printing process or a solder ball mounting process, and said flux cleaning is carried out after said solder electrode portion is coated with said flux and application of the heat treatment.

3. The flux cleaning method according to claim 1, wherein a temperature of said heat treatment is not lower than 150° C., and a period of said heat treatment is not shorter than one minute.

4. The flux cleaning method according to claim 1, wherein said flux includes a thixotropic substance.

5. The flux cleaning method according to claim 1, wherein said flux cleaning is carried out using a hydrocarbonic group cleaning agent.

6. A method of removing a flux residue from a semiconductor device having a solder electrode portion formed with a flux, said method comprising the steps of:

coating said solder electrode portion with a flux material that is not substantially comprised of a cleaning solution and applying a heat treatment thereto;

carrying out a flux cleaning for said solder electrode portion; and mounting a semiconductor chip on a printed circuit board via said solder electrode portion which is cleaned.

7. The method of fabricating the semiconductor device according to claim 6, wherein said solder electrode portion is formed by a solder paste printing or a solder ball mounting processes, said solder electrode portion is coated with said flux and subjected to said heat treatment, followed by said flux cleaning.

8. The method of fabricating the semiconductor device according to claim 6, wherein a temperature of said heat treatment is not lower than 150° C., and a period of said heat treatment is not shorter than one minute.

9. The method of fabricating the semiconductor device according to claim 6, wherein said flux contains a thixotropic substance.

10. The method of fabricating the semiconductor device according to claim 6, wherein said flux cleaning is carried out using a hydrocarbonic group cleaning agent.

11. The method of fabricating the semiconductor device according to claim 6, wherein said solder electrode portion is formed on a semiconductor wafer.

12. The method of fabricating the semiconductor device according to claim 6, wherein said solder electrode portion is formed on said printed circuit board.

13. A method of removing a flux reside from a solder electrode portion of a semiconductor device comprising the steps of:

applying flux material that is not substantially comprised of a cleaning solution to the solder electrode portion; and thereafter applying a heat treatment to the flux material.

* * * * *